United States Patent
Chen et al.

(10) Patent No.: US 6,728,323 B1
(45) Date of Patent: Apr. 27, 2004

(54) BASEBAND PROCESSORS, MOBILE TERMINALS, BASE STATIONS AND METHODS AND SYSTEMS FOR DECODING A PUNCTURED CODED RECEIVED SIGNAL USING ESTIMATES OF PUNCTURED BITS

(75) Inventors: Dayong Chen, Cary, NC (US); Evin Feli, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 624 days.

(21) Appl. No.: 09/612,713

(22) Filed: Jul. 10, 2000

(51) Int. Cl.⁷ .................. H04L 27/06; H03M 13/03
(52) U.S. Cl. ........................... 375/340; 714/790
(58) Field of Search ..................... 375/340, 341, 375/316; 714/794, 786, 790, 795, 799

(56) References Cited

U.S. PATENT DOCUMENTS

| | | | |
|---|---|---|---|
| 5,673,291 A | 9/1997 | Dent | 375/262 |
| 5,878,090 A | * 3/1999 | Stephens | 375/326 |
| 5,983,384 A | 11/1999 | Ross | 714/755 |
| 6,094,427 A | * 7/2000 | Yi | 370/331 |
| 6,157,683 A | 12/2000 | Daribi et al. | 375/341 |
| 6,192,500 B1 | * 2/2001 | Yang et al. | 714/786 |
| 6,233,712 B1 | 5/2001 | Rhee et al. | 714/789 |

FOREIGN PATENT DOCUMENTS

| | | |
|---|---|---|
| EP | 0 966 124 A2 | 12/1999 |
| JP | 10303866 A | 11/1998 |
| WO | WO 99/41840 | 8/1999 |

OTHER PUBLICATIONS

International Search Report for PCT/SE01/01605.
G. David Forney, *The Viterbi Algorithm*, Proceedings of the *IEEE*, vol. 61, No. 3, Mar. 1973.
George C. Clark, Jr., and J. Bibb Cain, *Error–Correction Coding for Digital Communications*, Proceedings of the *IEEE*, Mar. 1973.

* cited by examiner

*Primary Examiner*—Khai Tran
(74) *Attorney, Agent, or Firm*—Myers Bigel Sibley & Sajovec

(57) ABSTRACT

Methods, systems, baseband processors, mobile terminals and base stations are provided for decoding a punctured coded signal are provided. The signal is received to provide received symbols. Symbol positions associated with punctured locations are initialized to default symbol values. The received symbols and the default symbol values are error correction decoded to provide first signal estimates. Punctured location symbol estimates are generated based on the first signal estimates and the received symbols are combined with the punctured location symbol estimates placed in corresponding punctured locations. The combined received symbols with the punctured location symbol estimates are error correction decoded to provide second signal estimates.

28 Claims, 6 Drawing Sheets

BASEBAND PROCESSORS, MOBILE TERMINALS, BASE STATIONS AND METHODS AND SYSTEMS FOR DECODING A PUNCTURED CODED RECEIVED SIGNAL USING ESTIMATES OF PUNCTURED BITS

BACKGROUND OF THE INVENTION

The present invention relates to signal communications and, in particular, to reception of encoded signals over a communications channel.

The use of wireless communications is expanding rapidly, particularly as more radio spectrum becomes available for commercial use and as wireless phones become more commonplace. In addition, analog wireless communications are gradually being supplemented and even replaced by digital communications. In digital voice communications, speech is typically represented by a series of bits which may be modulated and transmitted from a base station of a wireless communications network to a mobile terminal device such as a wireless phone. The phone may demodulate the received waveform to recover the bits, which are then converted back into speech. In addition to voice communications, there is also a growing demand for data services, such as e-mail and Internet access, which typically utilize digital communications.

There are many types of digital communications systems. Traditionally, frequency-division-multiple-access (FDMA) is used to divide the spectrum up into a plurality of radio channels corresponding to different carrier frequencies. These carriers may be further divided into time slots, generally referred to as time-division-multiple-access (TDMA), as is done, for example, in the Digital-Advanced Mobile Phone Service (D-AMPS) and Global System for Mobile communication (GSM) standard digital cellular systems. Alternatively, if the radio channel is wide enough, multiple users can use the same frequencies using spread spectrum techniques and code-division-multiple-access (CDMA).

A typical digital communications system 19 is shown in FIG. 1. Digital symbols are provided to the transmitter 20, which maps the symbols into a representation appropriate for the transmission medium or channel (e.g. radio channel) and couples the signal to the transmission medium via antenna 22. The transmitted signal passes through the channel 24 and is received at the antenna 26. The received signal is passed to the receiver 28. The receiver 28 includes a radio processor 30, a baseband signal processor 32, and a post processing unit 34.

The radio processor typically tunes to the desired band and desired carrier frequency, then amplifies, mixes, and filters the signal to a baseband. At some point, the signal may be sampled and quantized, ultimately providing a sequence of baseband received samples. As the original radio signal generally has in-phase (I) and quadrature (Q) components, the baseband samples typically have I and Q components, giving rise to complex, baseband samples.

The baseband processor 32 may be used to detect the digital symbols that were transmitted. It may produce soft information as well, which gives information regarding the likelihood of the detected symbol values. The post processing unit 34 typically performs functions that depend on the particular communications application. For example, it may convert digital symbols into speech using a speech decoder.

A typical transmitter is shown in FIG. 2. Information bits, which may represent speech, images, video, text, or other content, are provided to forward-error-correction (FEC) encoder 40, which encodes some or all of the information bits using, for example, a convolutional encoder. The FEC encoder 40 produces coded bits, which are provided to an interleaver 42, which reorders the bits to provide interleaved bits. These interleaved bits are provided to a modulator 44, which applies an appropriate modulation for transmission. The interleaver 42 may perform a variety of types of interleaving.

The modulator 44 may apply any of a variety of modulations. Higher-order modulations are frequently utilized. One example is 8-PSK (8-ary phase shift keyed), in which 3 bits are sent using one of 8 constellation points in the in-phase (I)/ quadrature (Q) (or complex) plane. Another example is 16-QAM (16-ary quadrature amplitude modulated), in which 4 bits are sent at the same time. Higher-order modulation may be used with conventional, narrowband transmission as well as with spread-spectrum transmission.

In a conventional baseband processor, a baseband received signal is typically provided to a demodulator which produces soft bit values. These soft bit values are generally provided to a de-interleaver which reorders the soft bit values to provide de-interleaved soft bits. These de-interleaved soft bits may then be provided to a forward error correction (FEC) decoder which performs, for example, convolutional decoding, to produce detected information bits.

A second example of a conventional baseband processor employs multipass equalization, sometimes referred to as Turbo equalization, in which results, after decoding has completed, are passed back to the equalization circuit to re-equalize, and possibly re-decode, the received signal. Such a system is described, for example, in U.S. Pat. No. 5,673,291 to Dent et al. entitled "Simultaneous demodulation and decoding of a digitally modulated radio signal using known symbols" which is hereby incorporated herein by reference. In multi-pass equalization, the processor typically initially performs conventional equalization and decoding. After decoding, the detected information bits are encoded and then re-interleaved to provide information to the multipass equalizer and soft information generator which re-equalizes the received baseband signal using the detected bit values. Typically, because of diagonal interleaving or the fact that some bits are not convolutionally encoded, the second pass effectively uses error corrected bits, as determined and corrected in the first pass, to help detection of other bits, such as bits which were not error correction encoded.

Both single pass and multipass baseband processors as described above typically use conventional FEC decoders. Conventional FEC decoders typically treat each soft bit value as if it were independent of all other values. For example, in a Viterbi decoder for convolutional codes, soft bit values are generally correlated to hypothetical code bit values and added. As the soft bit values typically correspond to loglikelihood values, adding soft values corresponds to adding loglikelihoods or multiplying probabilities.

By way of background, error correction codes, such as convolutional codes, in essence, provide error correction capability by generating one or more "parity" bits for transmission from each data bit to be transmitted. The ratio of data symbols to parity symbols is referred to as a coding rate. For example, if two parity bits are generated for each data bit, the code is known as a rate 1/2 code, with twice as many parity bits as original data bits being transmitted. If the rate of transmission is fixed, the time required to transmit such parity bits is twice as long as the time required to transmit the original data bits. More generally, if r parity bits are generated for each data bit, the code is known as a rate 1/r code. Typically, the parity bit transmission rate is adopted to be r times the message information bit rate.

Tables of parity equations for various code rates and constraint lengths that result in optimum codes are published in the technical literature. See, e.g., G. Clarke, Jr., and J. Cain, Error-Correction Coding for Digital Communications, Appendix B, Plenum Press, New York (1981).

The known methods for decoding convolutional codes include threshold decoding, Sequential Maximum Likelihood Sequence Estimation (SMLSE), and the stack algorithm. The SMLSE technique is commonly known as the Viterbi algorithm, which is described in the literature including D. Forney, "The Viterbi Algorithm", Proc. IEEE, Vol. 61, pp. 268–278 (March, 1973).

As noted above, r times more parity symbols than input data symbols are produced for a rate 1/r code, and, if all parity symbols are transmitted, an r-times redundancy has been provided to combat errors. It will, however, be appreciated that it is not necessary to transmit all of the parity symbols. If the transmitter and receiver have previously agreed on some regular method of determining which parity symbols are not transmitted, the code is then known as a punctured convolutional code. Punctured codes typically result in coding rates m/r, such as 13/29, where adaptation to a transmission rate that is r/m times the message information bit rate is required.

Punctured convolutional codes are widely used in digital wireless systems, such as in GSM and in the emerging Enhanced General Packet Radio Service/Enhanced Data GSM Environment (EGPRS/EDGE). In these systems, convolutional coding is typically first applied to a block of payload data to produce an initial signal block, sometimes referred to as an initial mother codeword. Subsequent puncturing typically allows a single coder to derive multiple codewords corresponding to a variety of code rates. A codeword may then be transmitted by the sending end and subsequently received by the receiving end where decoding takes place.

Such punctured codes may be processed at the receiving end using soft decoding. Soft decoding is based on soft information related to received symbols. The received symbols are characterized not only by their bit polarities, i.e., one or zero, but also by a magnitude or quality measure generally referred to as soft information. Soft information with a large magnitude indicates that a one or zero, respectively, is received with high probability whereas soft information with a magnitude close or equal to 0 typically represents a received symbol that is ambiguous.

Before decoding, the receiving decoder typically reverses the puncturing by filling the punctured symbol positions with zeros. As zero valued symbol typically does not convey any useful information to the decoder, the more symbols that are punctured, the less powerful the punctured codeword is compared with its original mother codeword.

Puncturing may be used in incremental redundancy to divide a mother codeword into several increments of parity bits (incremental codewords). If a previously transmitted incremental codeword(s) cannot be decoded, additional incremental codewords may be sent until the combined incremental codewords can be successfully decoded to determine the original data block. For example, a received incremental codeword may be decoded and error correction applied. The error detection code (such as a cyclical redundancy check (CRC)) may then be used to check whether or not the decoded and error corrected symbols are error free. If there are still errors in the decoded and error corrected symbols, as indicated by the CRC test, the received incremental codeword is retained and transmission of an additional incremental codeword is requested by the receiving end.

Puncturing will now be further illustrated with reference to the schematic diagram of FIG. 3. A block of source (or payload) data symbols, which may include CRC and tail symbols, is illustrated at block 200. The source data symbols 200 are convolutionally encoded, using a rate 1/3 code in the illustrated example, to produce an initial mother codeword 210. As shown in FIG. 3, every third symbol (starting from the third symbol of the mother codeword) of the initial mother codeword 210 is punctured to provide an incremental codeword 215 for transmission which has an effective coding rate of 1/2. Two additional incremental codewords can be generated, again by puncturing every third symbol of the initial mother codeword, but starting from the first of the second symbol respectively. Both of these incremental codewords include the coded symbols $C_{13}, C_{23} \ldots, C_{N3}$ which were punctured in the first incremental codeword.

SUMMARY OF THE INVENTION

Methods for decoding a punctured coded signal are provided. The signal is received to provide received symbols. Symbol positions associated with punctured locations are initialized to default symbol values. The received symbols and the default symbol values are error correction decoded to provide first signal estimates. Punctured location symbol estimates are generated based on the first signal estimates and the received symbols are combined with the punctured location symbol estimates placed in corresponding punctured locations. The combined received symbols with the punctured location symbol estimates are error correction decoded to provide second signal estimates.

As will further be appreciated by those of skill in the art, while described above with reference to method aspects, the present invention may also be embodied as baseband processors, mobile terminals, base stations and systems.

DETAILED DESCRIPTION OF THE INVENTION

The present invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As will be appreciated by those of skill in the art, the present invention may be embodied as methods or devices. Accordingly, the present invention may take the form of a hardware embodiment, a software embodiment or an embodiment combining software and hardware aspects.

Figure 1:
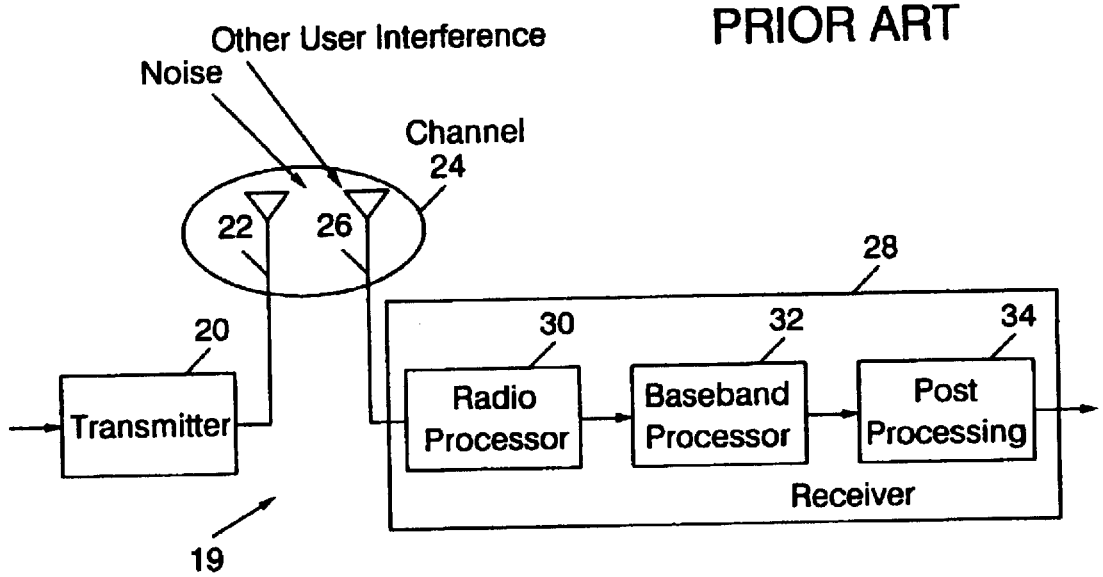
FIG. 1 is a block diagram illustrating a conventional communication system.
Figure 2:
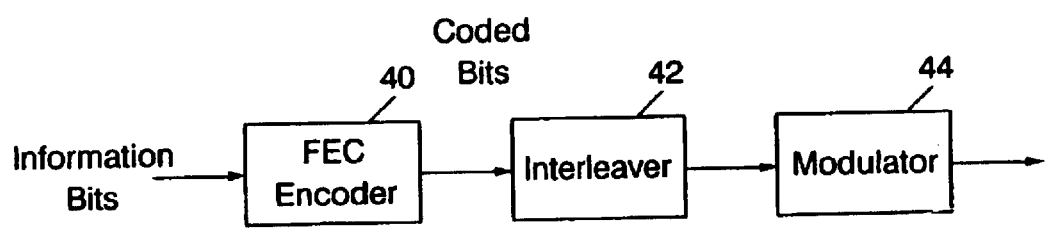
FIG. 2 is a block diagram illustrating a conventional transmitter.
Figure 3:
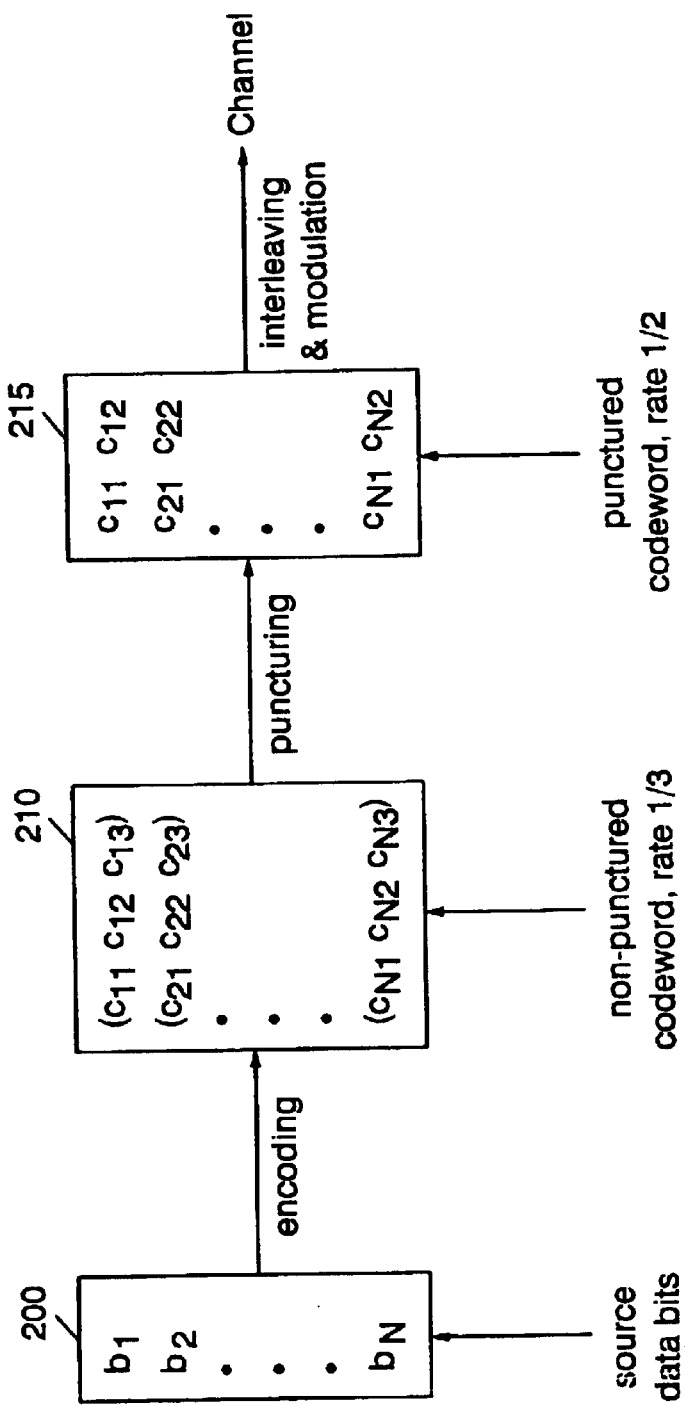
FIG. 3 is a schematic block diagram of coding using a punctured code according to the prior art.
Figure 4:
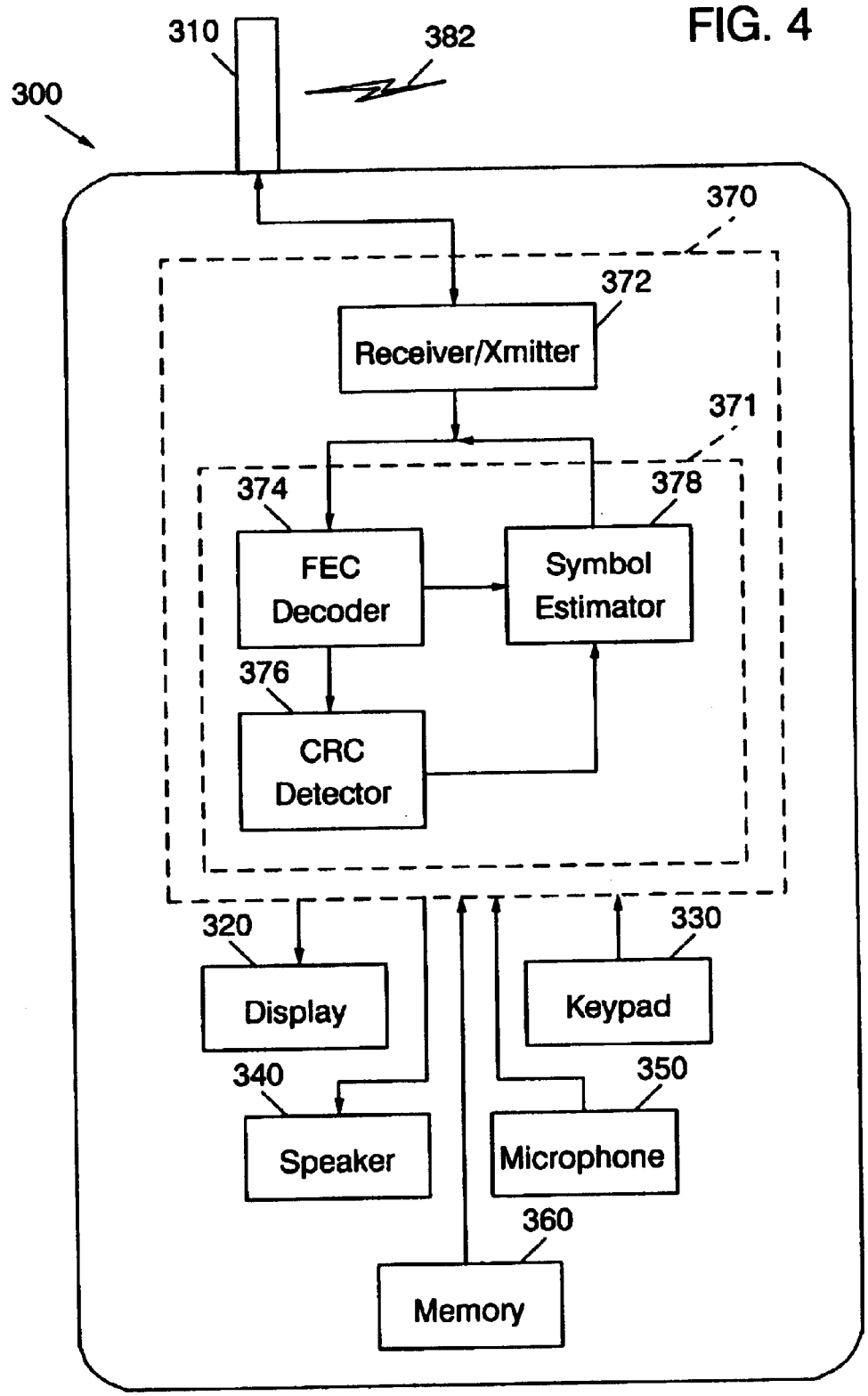
FIG. 4 is a block diagram illustrating a wireless communication terminal including a baseband processor according to embodiments of the present invention.

FIG. 4 illustrates exemplary mobile terminal 300 according to embodiments of the present invention. The mobile terminal 300 includes a transceiver (i.e., receiver and transmitter) 372 that is operative to transmit and receive RF communication signals via an antenna 310 under control of a controller 370. The controller 370 includes a baseband processor 371 as well as other functional modules not illustrated in FIG. 4 but which will be understood to those of skill in the art related to wireless communications including both data and voice communication support. The controller 370 processes messages to produce physical layer bursts that are transmitted over physical wireless channels by the transceiver 372 via the antenna 310. The baseband processor 371 includes a forward error correction (FEC) decoder 374, such as a convolutional decoder, an error detector 376, such as a cyclical redundancy check (CRC) error detector, and a punctured symbol estimate generator 378. The controller 370, such as a microprocessor, microcontroller or similar data processing device, may execute program instructions stored in a memory 360 of the mobile terminal 300, such as a dynamic random access memory (DRAM), electrically erasable programmable read-only memory (EEPROM) or other storage device. The controller 370 is further operatively associated with user interface components of the mobile terminal 300 such as a display 320, a keypad 330, a speaker 340, and a microphone 350, operations of which are known to those of skill in the art and will not be further discussed herein.

The transceiver 372 provides a receiver that receives a punctured coded signal and provides the signal to the baseband processor 371. The error correction decoder 374 is configured to generate estimates of a received punctured coded signal from the punctured coded signal and from punctured location symbol estimates. The punctured symbol estimate generator 378 generates the punctured location symbol estimates from estimates of a received punctured coded signal and provides the punctured location symbol estimates to the error correction decoder 374. The receiver 372 may be a demodulator configured to provide soft information to the baseband processor 371 as the received punctured coded signal. The error correction decoder 374 may be a convolutional decoder. The convolutional decoder may, for example, be a rate 1/3 convolutional decoder wherein the punctured coded signal is punctured to a higher coding rate than 1/3 for transmission to the terminal 300. As noted above, the error detector 376 may be a CRC error detector, coupled to the error correction decoder 374, that detects errors in the estimates of a received punctured coded signal provided by the error correction decoder 374. The CRC detector 376 may be coupled to the punctured symbol estimate generator 378 and may initiate generation of punctured location symbol estimates by the punctured symbol estimate generator 378.

It will be appreciated that the transceiver 372, the baseband processor 371 and other components of the mobile terminal 300 may be implemented using a variety of hardware and software. For example, operations of the transceiver 372 and/or the baseband processor 371 may be implemented using special-purpose hardware, such as an application specific integrated circuit (ASIC) and programmable logic devices such as gate arrays, and/or software or firmware running on a computing device such as a microprocessor, microcontroller or digital signal processor (DSP) as shown for the baseband processor 371 in FIG. 4. It will also be appreciated that, although functions of the transceiver 372 and/or the baseband processor circuit 371 may be integrated in a single device, such as a single ASIC microprocessor, they may also be distributed among several devices. Aspects of the transceiver 372, the baseband processor 371 and the controller 370 may also be combined in one or more devices, such as an ASIC, DSP, microprocessor or microcontroller.

It is further schematically illustrated in FIG. 4 that the mobile terminal 300 may receive communicated signals, such as the communication signal 382, from various communication service providers. It is to be further understood that a wireless communication system generating the communication signal 382 may include a variety of different configurations of components such as base stations, sometimes referred to as "base transceiver stations," mobile switching centers (MSCs), telecommunications switches, and other communications components.

While the present invention was described with reference to a mobile terminal above, it is to be understood that baseband processors of the present invention may be utilized in a variety of communication devices, including wireless communication devices such as radiotelephones. As described with reference to FIG. 4, radiotelephones typically include a transmitter, a receiver, a user interface and an antenna system. The antenna system may include an antenna feed structure and one or more antennas. The antenna system may be coupled to the baseband processor through circuitry, such as an RF processor, configured to step up signals for transmission to an assigned transmission frequency or to step down received signals from a modulation frequency to a baseband frequency. However, the baseband processor in some applications may couple directly to the antenna systems.

As is well known to those of skill in the art, the transmitter converts the information which is to be transmitted by radiotelephone into an electromagnetic signal suitable for radio communications. The receiver demodulates electromagnetic signals which are received by radiotelephone so as to provide the information contained in the signals to the user interface in a format which is understandable to the user. The receiver generally includes an RF processor and a baseband processor, in particular, a baseband processor of the present invention may be beneficially utilized as will be further described herein. A wide variety of transmitters, receivers, and user interfaces (e.g., microphones, keypads, displays) which are suitable for use with handheld radiotelephones are known to those of skill in the art, and such devices may be implemented in a radiotelephone including a baseband processor in accordance with the present invention. Other than the baseband processor according to the present invention, the design of such a radiotelephone is well known to those of skill in the art and will not be further described herein. It is further to be understood that the present invention is not limited to radiotelephones and may also be utilized with other wireless and wired communication receivers receiving punctured coded signals.

Furthermore, it is to be understood that, in various embodiments, the present invention is directed to mobile terminals and/or base stations utilizing baseband processors according to the present invention. As used herein, the term "base station" refers to a variety of relay components of a communication system which may communicate with a wireless terminal, such as base station controllers, mobile switching centers and the like.

According to the present invention, methods, systems and baseband processors are provided that may decode punctured received signals by using signal estimates for signal positions corresponding to punctured locations from a first decoding pass during a second decoding pass of the punctured received signals. The estimates for the punctured locations may be provided by encoding the first pass output and inserting the punctured location estimates in the punctured locations along with the received signals and then again error correction decoding the combined signal. The second pass of decoding may be utilized when errors are detected during the first pass. Re-transmission may be avoided where the signal estimates from the second pass of decoding contain no errors.

In embodiments of the present invention, methods for decoding a punctured coded signal are provided. The signal is received to provide received symbols. Symbol positions associated with punctured locations are initialized to default symbol values. The received symbols and the default symbol values are error correction decoded to provide first signal estimates. Punctured location symbol estimates are generated based on the first signal estimates and the received symbols are combined with the punctured location symbol estimates placed in corresponding punctured locations. The combined received symbols with the punctured location symbol estimates are error correction decoded to provide second signal estimates. The error correction decoding may be convolutional decoding. The punctured location symbol estimates may be generated by encoding the first signal estimates to provide a corrected signal and determining the punctured location symbol estimates based on signals in locations in the corrected signal corresponding to the punctured locations.

In other embodiments of the present invention, it is determined if the first signal estimates contain an error and punctured location symbol estimates are generated based on the first signal estimates if the first signal estimates contain an error. An error in the first signal estimate may be determined by detecting a CRC error in the first signal estimates.

In further embodiments of the present invention, the received symbols, the default symbol values and the punctured location symbol estimates are soft information. The soft information may have a low confidence value, a high confidence one value and a high confidence zero value. The symbol positions associated with punctured locations may be initialized to the low confidence value. The punctured location symbol estimates may be determined by converting the encoded signal estimates to soft information. The encoded signal estimates may be converted to soft information by converting encoded signal estimates in the punctured locations having a one value to the high confidence one value and converting the punctured locations having a zero value to the high confidence zero value.

In other embodiments of the present invention, the punctured coded signal is a signal coded at a low coding rate. The low coding rate may be a 1/2 coding rate. The combined received symbols with the punctured location symbol estimates may be error correction decoded to provide second signal estimates with performance equivalent to a lower coding rate, such as a rate 1/3.

In further embodiments of the present invention, it is determined if the second signal estimates contain an error. Transmission of additional signal information is requested if the second signal estimates contain an error. Transmission of punctured signals associated with the received punctured coded signal may be requested. Alternatively, re-transmission of the punctured coded signal may be requested.

In other embodiments of the present invention, methods are provided for decoding a punctured coded signal. A received punctured coded signal is error correction decoded to provide punctured location symbol estimates. The received punctured coded signal is error correction decoded using the punctured location symbol estimates to provide signal estimates of the received punctured coded signal. Error correction decoding may include combining symbol estimates of the received punctured coded signal with the punctured location symbol estimates placed in corresponding punctured locations and error correction decoding the combined received symbols with the punctured location symbol estimates to provide signal estimates of the received punctured coded signal.

In further embodiments of the present invention, baseband processors are provided for decoding a punctured coded signal. The baseband processors include an error correction decoder configured to generate estimates of a received punctured coded signal from the punctured coded signal and from punctured location symbol estimates. A punctured symbol estimate generator generates the punctured location symbol estimates from estimates of a received punctured coded signal and provides the punctured location symbol estimates to the error correction decoder. A demodulator configured to provide soft information as the received punctured coded signal may also be provided. The error correction decoder may be a convolutional decoder. The convolutional decoder may be a rate 1/3 convolutional decoder and the punctured coded signal may be punctured to a higher coding rate than 1/3. A CRC error detector may be coupled to the error correction decoder that detects errors in the estimates of a received punctured coded signal.

Operations according to embodiments of the present invention for decoding a punctured coded signal will now be further described with reference to the flowchart illustration of FIG. 5 and the schematic block diagram illustration of FIG. 6. Operations begin at block 500 when the receiver 372 receives the signal to provide received symbols to the baseband processor 371. An example of such a received symbol set is illustrated at block 600 of FIG. 6. Symbol positions associated with punctured locations are initialized to default symbol values (block 505). Such an initialized block is illustrated at block 605 of FIG. 6 where zero values, associated with low confidence received symbol information, are shown inserted in the codeword. The received symbols including the default initialized symbol values are error corrected decoded to provide first symbol estimates (block 510). Again referring to FIG. 6, an exemplary set of first signal estimates ($\overline{b}_1, \overline{b}_2 \ldots \overline{b}_N$) is illustrated at block 610.

Figure 6:
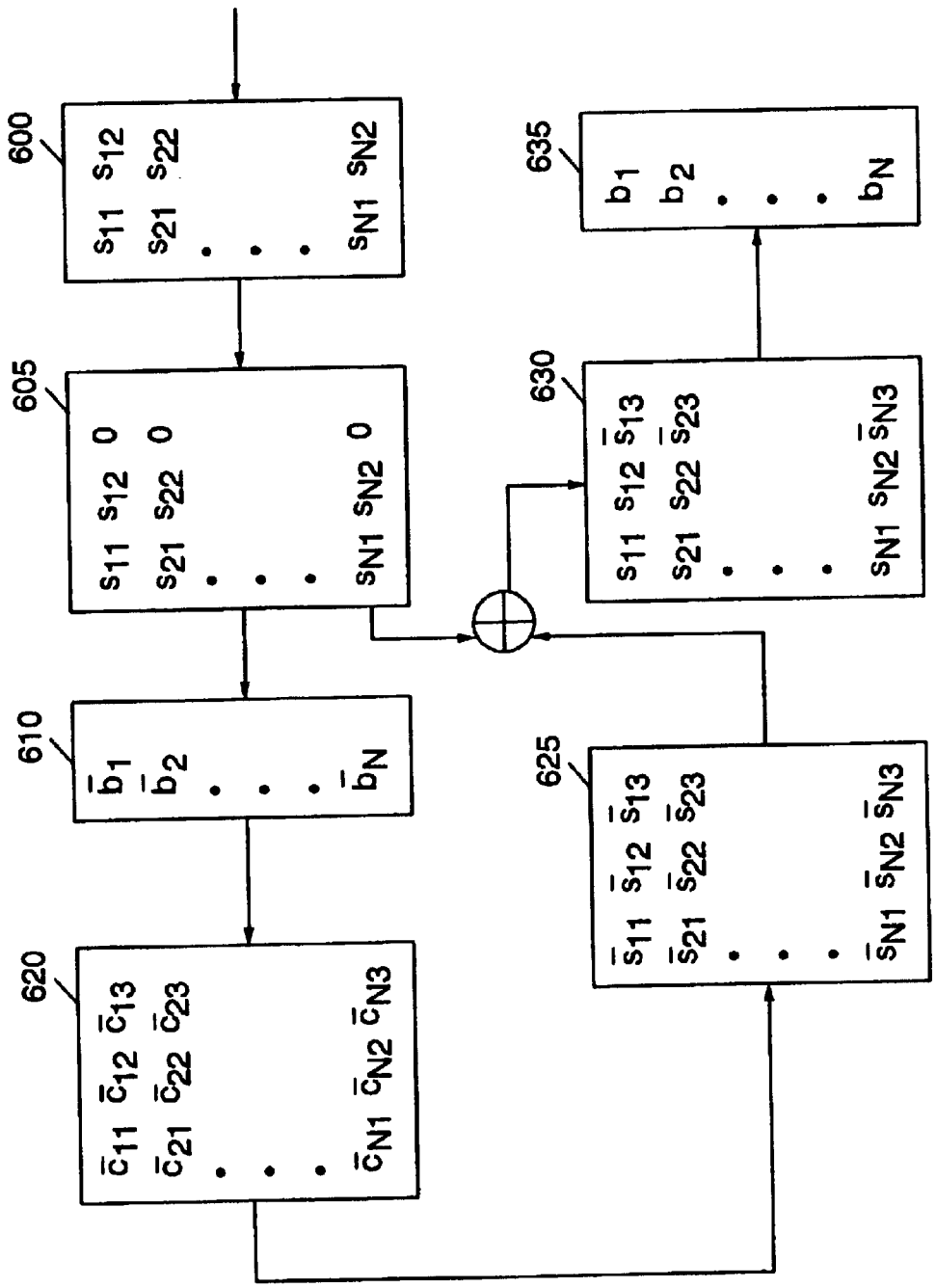
FIG. 6 is a schematic block diagram further illustrating the operations shown in FIG. 5.

Note that, as shown in the particular exemplary blocks of FIG. 6, the received signal is demodulated and deinterleaved to generate soft symbols of an incremental codeword of rate 1/2. The soft symbols at the punctured positions are set to zero to provide a codeword that a rate 1/3 decoder can use to attempt to decode the soft symbols. However, it is to be understood that these coding rates are provided for ease of understanding and the present invention is not limited to such particular coding rates.

The decoded symbols 610 may be checked to determine if the first signal estimates contain an error (block 515). If no error is detected, the first signal estimates may be accepted and operations may continue with receipt of subsequent codewords. If an error is detected, however, the first signal estimates 610 are encoded to provide a corrected signal (block 520). A corrected signal ($\bar{c}_{11} \ldots \bar{c}_{N3}$) codeword at rate 1/3 is illustrated at block 620 for the example of FIG. 6. The corrected signal is converted to soft information (block 525). The soft information based corrected signal codeword ($\bar{s}_{11} \ldots \bar{s}_{N3}$) is illustrated for the example of FIG. 6 at block 625. Thus, operations at block 520 and block 525 generate punctured location symbol estimates based on the first signal estimates, more particularly, based on signals in locations in the corrected signal corresponding to the punctured locations. For example, with reference to block 625 of FIG. 6, the signals $\bar{s}_{13}, \bar{s}_{23} \ldots \bar{s}_{N3}$.

The default symbol values and the punctured location symbol estimates may be soft information. The soft information may have a low confidence value, a high confidence one value and a high confidence zero value corresponding to the respective candidate received signal states of one and zero. The initializing of punctured locations at block 505 may comprise initializing symbol positions associated with punctured locations to the low confidence value. Operations related to converting the encoded signal estimates to soft information at block 525 may include converting encoded signal estimates in the punctured locations having a one value to a high confidence one value and converting the punctured locations having a zero value to the high confidence zero value. For example, if three bit soft information is used, the binary "1" and "0" may be replaced by +7 and −7 respectively.

The received symbols are then combined with the punctured location symbol estimates placed in corresponding punctured locations (block 530). The combining operation and the resulting codeword is illustrated at block 630 in the example of FIG. 6. The received symbols with the punctured location symbol estimates placed in corresponding locations are then error correction decoded to provide second signal estimates (block 535). Again, for the example of FIG. 6, the second signal estimates are illustrated at block 635. Thus, the soft information for the symbols that were not actually transmitted (i.e., the punctured symbols), shown in block 630 as $\bar{s}_{13}, \bar{s}_{23}, \ldots \bar{s}N_3$ are combined with the soft symbols derived from the initially received incremental codeword, shown in block 630 of FIG. 6 as $s_{11}$ through $sN_2$. A codeword with an effective code rate of 1/3 is thus provided which contains the punctured location symbol estimates derived from the first pass of error correction decoding.

Operations in various embodiments continue by determining if the second signal estimates contain an error (block 540). If an error is still detected, transmission of additional signal information may be requested (block 545). T transmission of the punctured signals associated with the received punctured coded signal may be requested. Operations as described with reference to FIG. 5 may be repeated for subsequently received codewords.

Operations according to the present invention for decoding a punctured decoded signal will now be further described with reference to the embodiments illustrated in the flowchart diagram of FIG. 7. A received punctured coded signal is error correction decoded to provide punctured location symbol estimates (block 700). The received punctured coded signal is then error correction decoded using the punctured location signal estimates to provide signal estimates of the received punctured coded signal as will be described with reference to blocks 705 and 710. First, the symbol estimates of the received punctured coded signal are combined with the punctured location symbol estimates placed in corresponding punctured locations (block 705). The combined received symbols with the punctured location symbol estimates are error correction decoded to provide signal estimates of the received punctured coded signal (block 710).

By utilizing information regarding punctured symbols from a first pass of error correction decoding, the present invention may provide improved performance, such as improved throughput versus carrier to interference (C/I) ratio due to the potentially reduced amount of re-transmission required. Furthermore, performance comparable to a first rate decoding, such as 1/3, may be provided with only one incremental codeword of a different coding rate transmitted, such as a coding rate of 1/2 for the transmitted codeword. Thus, a punctured coded signal coded at a first coding rate may be processed in accordance with the present invention in a manner which may provide signal estimates with performance equivalent to a higher coding rate. Such results may be provided where the corrected incremental codeword provided in accordance with the present invention contains fewer errors than the initially received incremental codeword and may then, potentially, be error correction decoded to provide signal estimates with no error even where errors were encountered after the first pass of decoding. Increased efficiency of incremental redundancy may also be provided as, after one or more re-transmissions, the effective coding rate is low, which typically implies high coding gain and fewer errors in the corrected codeword. In addition, there may be reduced demand on the memory of the receiving device as, upon successful decoding, the memory used to store the received incremental codeword(s) may be released. This aspect may be particularly beneficial, for example, when utilizing an Automatic Repeat Request (ARQ) protocol, which typically uses a large window size.

Figure 5:
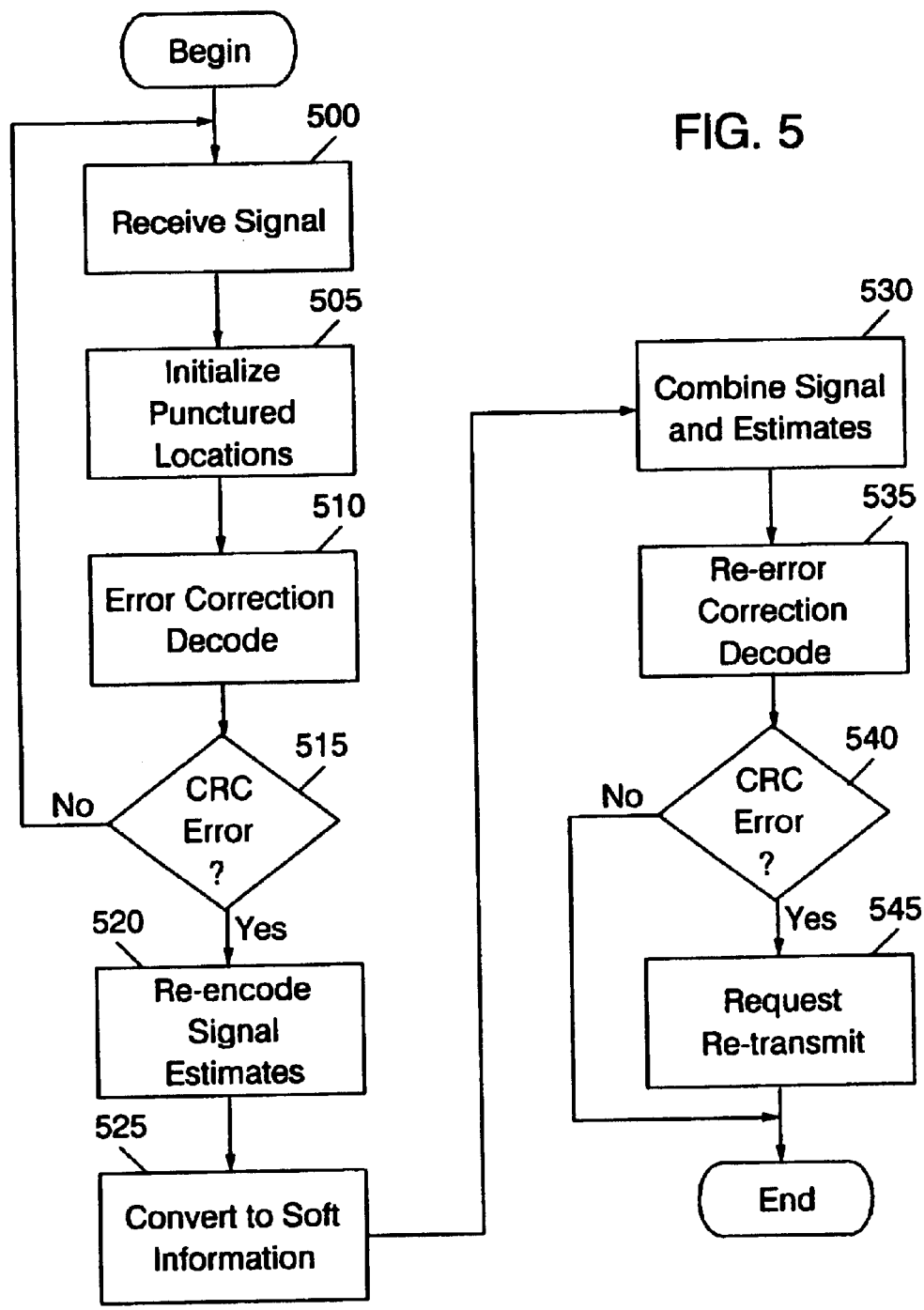
FIG. 5 is a flowchart illustrating baseband processing operations according to embodiments of the present invention.
Figure 7:
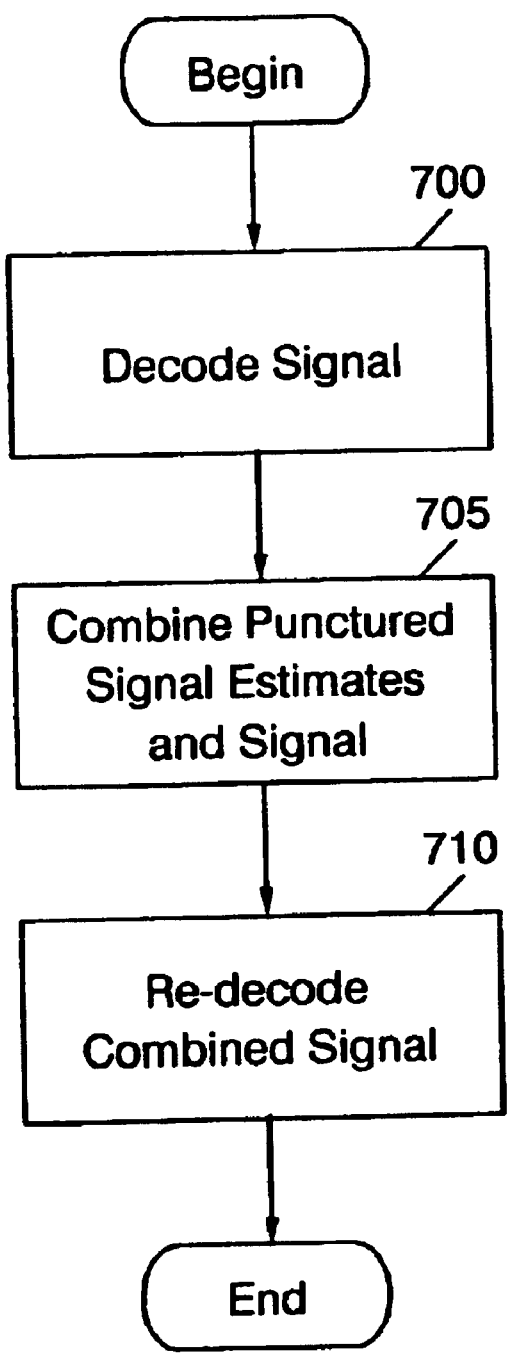
FIG. 7 a flowchart illustrating baseband processing operations according to further embodiments of the present invention.

Operations of the present invention have been described with respect to the block diagram illustrations of FIGS. 4 and 6 and the flowchart illustrations of FIGS. 5 and 7. It will be understood that each block of the flowchart illustrations and the block diagram illustrations of FIGS. 4 through 7, and combinations of blocks in the flowchart illustrations and the block diagram illustrations, can be implemented by computer program instructions. These program instructions may be provided to a processor to produce a machine, such that the instructions which execute on the processor create means for implementing the functions specified in the flowchart and block diagram block or blocks. The computer program instructions may be executed by a processor to cause a series of operational steps to be performed by the processor to produce a computer implemented process such that the instructions which execute on the processor provide steps for implementing the functions specified in the flowchart and block diagram block or blocks.

Accordingly, blocks of the flowchart illustrations and the block diagrams support combinations of means for performing the specified functions, combinations of steps for performing the specified functions and program instruction means for performing the specified functions. It will also be understood that each block of the flowchart illustrations and block diagrams, and combinations of blocks in the flowchart illustrations and block diagrams, can be implemented by special purpose hardware-based systems which perform the specified functions or steps, or combinations of special purpose hardware and computer instructions. For example the demodulator 372 and the baseband processor 371 may be implemented as code executing on a processor, as integrated circuit devices, such as signal processors or custom chips, or as a combination of the above.

In the drawings and specification, there have been disclosed typical illustrative embodiments of the invention and, although specific terms are employed, they are used in a generic and descriptive sense only and not for purposes of limitation, the scope of the invention being set forth in the following claims.

What is claimed is:

1. A method for decoding a punctured coded signal, comprising:

receiving the signal to provide received symbols;

initializing symbol positions associated with punctured locations to default symbol values;

error correction decoding the received symbols and the default symbol values to provide first signal estimates;

generating punctured location symbol estimates based on the first signal estimates;

combining the received symbols with the punctured location symbol estimates placed in corresponding punctured locations;

error correction decoding the combined received symbols with the punctured location symbol estimates to provide second signal estimates;

determining if the second signal estimates contain an error; and requesting transmission of punctured signals associated with the received punctured coded signal if the second signal estimates contain an error.

2. The method of claim 1 wherein error correction decoding the received symbols and the default symbol values to provide first signal estimates comprises convolutional decoding the received symbols and the default symbol values to provide first signal estimates.

3. The method of claim 2 wherein generating punctured location symbol estimates based on the first signal estimates comprises:

encoding the first signal estimates to provide a corrected signal; and determining the punctured location symbol estimates based on signals in locations in the corrected signal corresponding to the punctured locations.

4. The method of claim 3 further comprising determining if the first signal estimates contain an error; and wherein generating punctured location symbol estimates based on the first signal estimates comprises generating punctured location symbol estimates based on the first signal estimates if the first signal estimates contain an error.

5. The method of claim 4 wherein determining if the first signal estimates contain an error comprises detecting a CRC error in the first signal estimates.

6. The method of claim 3 wherein the received symbols, the default symbol values and the punctured location symbol estimates are soft information, the soft information having a low confidence value, a high confidence one value and a high confidence zero value and wherein initializing symbol positions associated with punctured locations to default symbol values comprises initializing symbol positions associated with punctured locations to the low confidence value.

7. The method of claim 6 wherein determining the punctured location symbol estimates based on signals in locations in the corrected signal corresponding to the punctured locations comprises converting the corrected signal to soft information.

8. The method of claim 7 wherein converting the corrected signal to soft information comprises converting the corrected signal in the punctured locations having a one value to the high confidence one value and converting the corrected signals in the punctured locations having a zero value to the high confidence zero value.

9. The method of claim 8 wherein the punctured coded signal comprises a signal coded at a low coding rate.

10. The method of claim 9 wherein the low coding rate is a 1/2 coding rate and wherein error correction decoding the combined received symbols with the punctured location symbol estimates to provide second signal estimates provides performance equivalent to a lower coding rate.

11. A baseband processor for decoding a punctured coded signal, comprising:

an error correction decoder configured to generate estimates of a received punctured coded signal from the punctured coded signal combined with punctured location symbol estimates;

a punctured symbol estimate generator that generates the punctured location symbol estimates from estimates of a received punctured coded signal and provides the punctured location symbol estimates to the error correction decoder;

an error detector that determines if the estimates of a received punctured coded signal from the punctured coded signal combined with punctured location symbol estimates contain an error; and a transceiver that requests transmission of punctured signals associated with the received punctured coded signal if the estimates of a received punctured coded signal from the punctured coded signal combined with punctured location symbol estimates contain an error.

12. The baseband processor of claim 11 further comprising a demodulator configured to provide soft information as the received punctured coded signal.

13. The baseband processor of claim 12 wherein the error correction decoder is a convolutional decoder.

14. The baseband processor of claim 12 wherein the convolutional decoder is a rate 1/3 convolutional decoder and wherein the punctured coded signal is punctured to a higher coding rate than 1/3.

15. A system for decoding a punctured coded signal, comprising:

means for receiving the signal to provide received symbols;

means for initializing symbol positions associated with punctured locations to default symbol values;

means for error correction decoding the received symbols and the default symbol values to provide first signal estimates;

means for generating punctured location symbol estimates based on the first signal estimates;

means for combining the received symbols with the punctured location symbol estimates placed in corresponding punctured locations;

means for error correction decoding the combined received symbols with the punctured location symbol estimates to provide second signal estimates;

means for determining if the second signal estimates contain an error; and means for requesting transmission of punctured signals associated with the received punctured coded signal if the second signal estimates contain an error.

16. The system of claim 15 wherein the means for error correction decoding the received symbols and the default symbol values to provide first signal estimates comprises means for convolutional decoding the received symbols and the default symbol values to provide first signal estimates and wherein the means for generating punctured location symbol estimates based on the first signal estimates comprises:

means for encoding the first signal estimates to provide a corrected signal; and means for determining the punctured location symbol estimates based on signals in locations in the corrected signal corresponding to the punctured locations.

17. The system of claim 16 wherein the received symbols, the default symbol values and the punctured location symbol estimates are soft information, the soft information having a low confidence value, a high confidence one value and a high confidence zero value and wherein the means for initializing symbol positions associated with punctured locations to default symbol values comprises means for initializing symbol positions associated with punctured locations to the low confidence value.

18. The system of claim 17 wherein the means for determining the punctured location symbol estimates based on signals in locations in the corrected signal corresponding to the punctured locations comprises means for converting encoded signal estimates in the punctured locations having a one value to the high confidence one value and converting the punctured locations having a zero value to the high confidence zero value.

19. A mobile terminal comprising:

an antenna that receives a punctured coded signal;

a receiver coupled to the antenna that generates soft information associated with the received punctured coded signal; and a baseband processor coupled to the receiver, the baseband processor comprising:

an error correction decoder configured to generate estimates of the received punctured coded signal from the soft information associated with the received punctured coded signal and from punctured location symbol estimates;

a punctured symbol estimate generator that generates the punctured location symbol estimates from estimates of a received punctured coded signal and provides the punctured location symbol estimates to the error correction decoder;

an error detector that determines if the estimates of a received punctured coded signal from the punctured coded signal combined with punctured location symbol estimates contain an error; and a transceiver that requests transmission of punctured signals associated with the received punctured coded signal if the estimates of a received punctured coded signal from the punctured coded signal combined with punctured location symbol estimates contain an error.

20. The mobile terminal of claim 19 wherein the receiver further comprises a demodulator configured to provide the soft information associated with the received punctured coded signal.

21. The mobile terminal of claim 20 wherein the error correction decoder comprises a convolutional decoder.

22. The mobile terminal of claim 21 wherein the error detector further comprises a CRC error detector.

23. The mobile terminal of claim 22 wherein the convolutional decoder is a rate 1/3 convolutional decoder and wherein the punctured coded signal is punctured to a higher coding rate than 1/3.

24. A base station comprising:

an antenna that receives a punctured coded signal;

a receiver coupled to the antenna that generates soft information associated with the received punctured coded signal; and a baseband processor coupled to the receiver, the baseband processor comprising:

an error correction decoder configured to generate estimates of the received punctured coded signal from the soft information associated with the received punctured coded signal and from punctured location symbol estimates;

a punctured symbol estimate generator that generates the punctured location symbol estimates from estimates of a received punctured coded signal and provides the punctured location symbol estimates to the error correction decoder;

an error detector that determines if the estimates of a received punctured coded signal from the punctured coded signal combined with punctured location symbol estimates contain an error; and a transceiver that requests transmission of punctured signals associated with the received punctured coded signal if the estimates of a received punctured coded signal from the punctured coded signal combined with punctured location symbol estimates contain an error.

25. The base station of claim 24 wherein the receiver further comprises a demodulator configured to provide the soft information associated with the received punctured coded signal.

26. The base station of claim 25 wherein the error correction decoder comprises a convolutional decoder.

27. The base station of claim 26 wherein the error detector further comprises a CRC error detector.

28. The base station of claim 27 wherein the convolutional decoder is a rate 1/3 convolutional decoder and wherein the punctured coded signal is punctured to a higher coding rate than 1/3.

\* \* \* \* \*